United States Patent [19]
Razon et al.

[11] Patent Number: 5,950,070
[45] Date of Patent: Sep. 7, 1999

[54] METHOD OF FORMING A CHIP SCALE PACKAGE, AND A TOOL USED IN FORMING THE CHIP SCALE PACKAGE

[75] Inventors: Eli Razon, Maple Glen; Walter Von Seggern, New Hope, both of Pa.

[73] Assignee: Kulicke & Soffa Investments, Wilmington, Del.

[21] Appl. No.: 08/857,708

[22] Filed: May 15, 1997

[51] Int. Cl.$^6$ .................................................. H01L 21/44
[52] U.S. Cl. ........................ 438/113; 438/124; 438/460; 438/617
[58] Field of Search .................................. 438/113, 112, 438/124, 127, 460, 617

[56] References Cited

U.S. PATENT DOCUMENTS

| | | | |
|---|---|---|---|
| 4,426,773 | 1/1984 | Hargis | 438/113 |
| 5,126,286 | 6/1992 | Chance | 438/113 |
| 5,139,972 | 8/1992 | Neugebauer et al. | 438/113 |
| 5,148,265 | 9/1992 | Khandros et al. | |
| 5,258,330 | 11/1993 | Khandros et al. | |
| 5,282,312 | 2/1994 | DiStefano et al. | |
| 5,346,861 | 9/1994 | Khandros et al. | |
| 5,347,159 | 9/1994 | Khandros et al. | |
| 5,367,764 | 11/1994 | DiStefano et al. | |
| 5,390,844 | 2/1995 | Distefano et al. | |
| 5,398,863 | 3/1995 | Grube et al. | |
| 5,414,298 | 5/1995 | Grube et al. | |
| 5,455,390 | 10/1995 | DiStefano et al. | |

(List continued on next page.)

FOREIGN PATENT DOCUMENTS

| | | |
|---|---|---|
| 0276669 | 8/1988 | European Pat. Off. . |
| 3608009 A1 | 9/1987 | Germany . |
| 4022664 | 1/1992 | Germany . |
| WO95/11107 | 4/1995 | WIPO . |

OTHER PUBLICATIONS

Kulicke &n Soffa General Spec Brochure for Model 1474 Aluminum and Gold Wedge Bonder, 1996.
Kulicke & Soffa General Spec Brochure for Model 1470/1478 Large Area Automatic Wedge Bonders, 1996.
J. Simon et al., "A Critical Review of Chip Scale Packaging", Chipcon™ 3 97 © 1997 Semiconductor Technology Center, Inc., pp. 110–119.
Steve Greathouse, "Chip Scale Package Solutions—The Pro's and Cons", Chipcom™ '97 © 1997 Semiconductor Technology Center, Inc., pp. 1–9.

(List continued on next page.)

*Primary Examiner*—Kevin M. Picardat
*Attorney, Agent, or Firm*—Ratner & Prestia

[57] ABSTRACT

A method of assembling a plurality of semiconductor chips is provided. A portion of a semiconductor wafer containing the plurality of chips is provided. Each of the plurality of chips has a contact pattern area including a pattern of contacts on a surface of the chip. A respective section of a dielectric interposer is assembled to each respective one of the plurality of chips individually, without detaching the plurality of chips from the portion of the semiconductor wafer. Each section of interposer has a plurality of bonding pads near an outer periphery of the section, so that each bonding pad lies near the contact pattern area of the corresponding one of the plurality of chips. Each bonding pad is wire bonded to a respective one of the contacts on the front surface of the corresponding one of the plurality of chips. The bonding step includes: (1) bonding one end of each wire to a respective bonding pad of the interposer using microresistant welding or ultrasonic bonding, and (2) bonding the other end of each wire to a respective contact of the chip using ultrasonic bonding If a defective bond is detected, a wire may be removed and replaced by wire bonding. An encapsulant is applied to encapsulate the wires on each of the plurality of chips. The encapsulated chips are cut from the semiconductor wafer. Wires may be bonded at the corners of the chip, and need not be perpendicular to the sides of the chip.

15 Claims, 7 Drawing Sheets

OTHER PUBLICATIONS

| | | |
|---|---|---|
| 5,477,611 | 12/1995 | Sweis et al. . |
| 5,489,749 | 2/1996 | DiStefano et al. . |
| 5,491,302 | 2/1996 | Distefano et al. . |
| 5,518,964 | 5/1996 | DiStefano et al. . |
| 5,525,545 | 6/1996 | Grube et al. . |
| 5,536,909 | 7/1996 | DiStefano et al. . |
| 5,548,091 | 8/1996 | DiStefano et al. . |
| 5,557,501 | 9/1996 | DiStefano et al. . |
| 5,558,270 | 9/1996 | Nachon et al. . |
| 5,558,928 | 9/1996 | DiStefano et al. . |
| 5,570,504 | 11/1996 | DiStefano et al. . |
| 5,583,321 | 12/1996 | DiStefano et al. . |
| 5,590,460 | 1/1997 | DiStefano et al. . |
| 5,597,470 | 1/1997 | Karavakis et al. . |
| 5,615,824 | 4/1997 | Fjelstad et al. . |
| 5,619,017 | 4/1997 | Distefano et al. . |
| 5,731,222 | 3/1998 | Malloy et al. ......................... 438/113 |

OTHER PUBLICATIONS

"3C (Crack Control Configuration) Wedge", Micro–Swiss, pp. 2–3 (No Date).

MRW—Electrode Specification Sheet, one page (No Date).

K. V. Slee, "Micro–welding of thin sheet components", Sheet Metal Industries, Jul. 1978, pp. 772, 775, 776, 799.

METHOD OF FORMING A CHIP SCALE PACKAGE, AND A TOOL USED IN FORMING THE CHIP SCALE PACKAGE

BACKGROUND OF THE INVENTION

This invention relates generally to semiconductor device fabrication, and more specifically to methods and tools for forming chip scale packages.

DESCRIPTION OF THE RELATED ART

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

The most common of these processes is wire bonding. In wire bonding, a plurality of bonding pads are located in a pattern on the top surface of the substrate, with the chip mounted in the center of the pattern of bonding pads, with the top surface of the chip facing away from the top surface of the substrate. Fine wires (which may be aluminum or gold wires) are connected between the contacts on the top surface of the chip and the contacts on the top surface of the substrate. U.S. Pat. Nos. 5,205,463 to Holdgrafer et al., 5,469,011 to Safabakhsh, and 5,558,270 to Nachon et al., (all assigned to Kulicke and Soffa Investments, Inc.) are hereby expressly incorporated by reference herein for their teachings on methods and tools used in wire bonding generally, and in particular, wedge bonding.

In tape automated bonding systems, a polymer tape having thin flexible conductors is used. The chip is mounted on the tape, so that the contacts of the chip interface with the conductors on the tape to make electrical connections. The conductors are connected to the substrate via additional leads. The tape contains many chips in a linear arrangement. The tape is advanced linearly through a series of stations at which the various fabrication operations are performed on the tape. Typically, in a TAB system, the bonding pads on the chip are at the outer perimeter of the chip.

In flip chip systems, a plurality of contact pads are arranged on the front surface of the chip and can occupy a large portion of the area of the chip. Solder bumps are formed on the contact pads. The chip is flipped over so the solder bumps confront contacts on the surface of the substrate. The device is heated to reflow the solder bumps, and the chip is connected directly to the substrate. As a result, there is no fan out required, and the footprint required is equal to the footprint of the chip. However, the flip chip system often suffers from reliability problems, because of a mismatch between the respective coefficients of thermal expansion of the chip and the substrate. Differential expansion of the chip and substrate stress the solder bonds and may cause them to fail after thermal cycling.

Chip scale packages (CSPs) offer a solution to the challenge of shrinking the size of semiconductor devices relative to the size of the chip (die) contained in the package. Typically, the CSP size is between 1 and 1.2 times the perimeter size of the die, or 1.5 times the area of the die. The CSP offers a compact size near that of a bare die or flip chip technology, and offers greater reliability, because the CSP need not suffer from the same thermal expansion incompatibility problems which are known in flip chips.

Most CSPs use a flexible, sheetlike interposer (e.g., a polyimide film or tape), having fine, flexible wiring embedded therein. The fine wirings in the interposer end at peripheral terminals near the periphery of the chip when the chip is mounted on the interposer. An example is the Micro Ball Grid Array (Micro BGA) design. The wirings redistribute the peripheral terminals of the interposer to a grid array of solder ball lands that cover the interior area of the chip. The chip is mounted on the interposer, and the plurality of terminals in the interposer are bonded to the plurality of contacts on the periphery of the chip using a conventional bonding technique, such as ultrasonic (wedge) bonding. Once bonded, the terminals are encapsulated for protection using an elastomeric encapsulant that permits flexible movement of the terminals during thermal cycling due to differential expansion between the chip and the substrate. The solder balls are then formed on lands on the top surface of the interposer, and the individual chip packages are cut from the tape. The ball grid array can be evenly spaced at the minimum required pitch for solder connections to the substrate (which may be of the order of 0.5 mm between balls), achieving a high density of contacts. Because the interposer has a ball grid array covering most of the surface area of the chip, the BGA design results in a package size that is nearly as small as the chip itself.

U.S. Pat. No. 5,346,861 (hereafter, the "'861 Patent") to Khandros is expressly incorporated by reference herein for its teachings on fabrication of a CSP of the Micro BGA type. In the '861 Patent, the chip has contacts distributed throughout the interior area of its top surface. The interposer has a respective aperture which is substantially aligned with each respective contact on the chip. For each contact on the chip, a corresponding flexible lead is formed on the interposer, ending in a terminal which is disposed adjacent to one of the apertures in the interposer. The leads and terminals are formed on the interposer using conventional printed circuit manufacturing techniques before formation of the apertures. The chip is mounted on the tape, and a tool is used to individually bond each of the terminals to a respective contact on the chip which corresponds to the terminal. The end of the flexible lead opposite the terminal end connects to a solder ball land, on which a solder ball is applied.

Because the Micro BGA process includes the step of mounting individual chips on the tape, the process has some disadvantages. In particular, it is difficult to obtain extremely accurate registration of the components because of the flexibility of the tape. Further, as is the case with any TAB process, the chips proceed on the tape linearly through a series of stations. If any of these stations is unavailable due to an equipment failure, then the entire process is stopped.

The '861 Patent generally describes a wafer level integration process, in which, instead of attaching a multiplicity of cut chips to a long tape, individual interposers, similar to the interposer described above with reference to the '861 Patent, are positioned on each chip, individually, while the chips are still on the wafer. The interposers are assembled to the chips before the chips are separated from the wafer. The contacts on each chip are secured to the terminals of each interposer and the contacts of each chip are encapsulated. The individual chips are separated from the wafer and from one another by cutting the wafer using a conventional wafer severing or "dicing" equipment. This process yields a plurality of chip and interposer subassemblies.

Wafer level integration is desirable, because the wafer is a rigid body, allowing more accurate and predictable registration for all fabrication processes prior to the dicing step. However, improved wafer level integration techniques are desired.

SUMMARY OF THE INVENTION

The present invention is a method of assembling a plurality of semiconductor chips. A portion of a semiconductor wafer containing the plurality of chips is provided. Each of the plurality of chips has a contact pattern area including a pattern of contacts on a surface of the chip. A respective section of a flexible sheetlike dielectric interposer is assembled to each respective one of the plurality of chips individually, without detaching the plurality of chips from the semiconductor wafer. Each section of interposer has a plurality of bonding pads near an outer periphery of the section, so that each bonding pad lies near the contact pattern area of the corresponding one of the plurality of chips. Each bonding pad is wire bonded to a respective one of the contacts on the front surface of the corresponding one of the plurality of chips. An encapsulant is applied to encapsulate the wires on each of the plurality of chips. The encapsulated chips are cut from the semiconductor wafer.

According to another aspect of the invention, a method of assembling a semiconductor chip package is provided. A semiconductor chip is provided, having a contact pattern area including a pattern of contacts on a surface of the chip. A section of a dielectric interposer is assembled to the chip. The section of interposer has a plurality of bonding pads near an outer periphery of the section, such that each bonding pad lies near the contact pattern area of the chip. Each bonding pad is wire bond to a respective one of the contacts on the front surface of the chip. The wire bonding step includes: (1) bonding one end of each wire to a respective bonding pad of the interposer using micro-resistant welding, and (2) bonding the other end of each wire to a respective contact of the chip using ultrasonic bonding. An encapsulant is applied to encapsulate the wires on the chip.

According to still another aspect of the invention, a wedge bonding tool for use in a wire bonder is provided. The wedge bonding tool comprises a body portion made of an electrically conductive material. The body portion includes first and second electrodes and an insulating spacer separating the first and second electrodes. A wedge working tip is provided on one end of the body portion. The wedge working tip has a foot and a wire hole through the wedge working tip, for directing a wire under the foot. One end of the first conductor forms a first portion of the wedge working tip. One end of the second conductor forms a second portion of said wedge working tip.

These and other aspects of the invention are set forth below with reference to the drawings and the description of exemplary embodiments of the invention.

DETAILED DESCRIPTION

Figure 1:
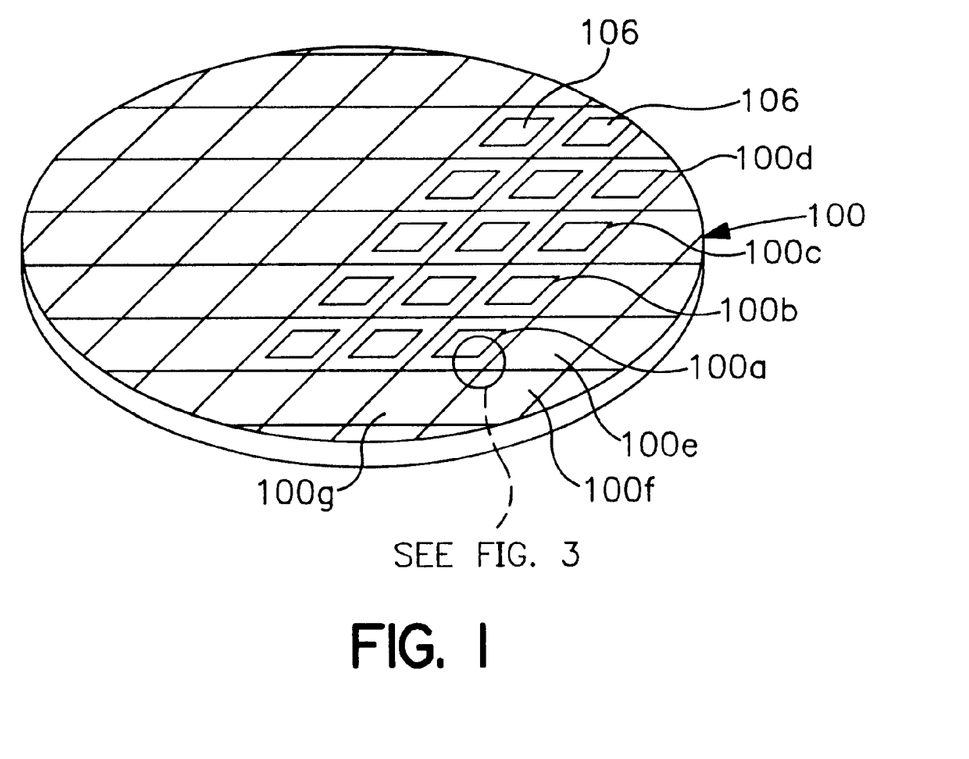
FIG. 1 is a diagram of a semiconductor wafer on which individual interposers are being deposited using an exemplary method according to the invention.

FIG. 1 is an isometric view of an exemplary semiconductor wafer 100 during the fabrication of semiconductor devices using an exemplary process according to the invention, hereafter referred to as the, "wafer-level micro ball grid array process." A conventional semiconductor wafer 100 has a plurality of chips, or dies, 100a, 100b, . . . formed on its top surface. The chips may be any semiconductor chip, and are not limited to any function or any type of semiconductor material. For example, the chips may be Silicon based, Galium Arsenide based, or may be based on another suitable material. Although the invention may be used for any function of chip or any chip having either low or high pin count, the exemplary embodiment is a chip having a "low" pin count of 256 pins or less, such as a memory device.

Prior to the integration of the devices 101, each chip on wafer 100 is tested using conventional electrical test equipment, and any defective chips are identified. The tests determine whether each individual chip 100a, 100b etc. on the portion of the semiconductor wafer 100 complies with a predetermined set of acceptance criteria. Preferably, only those chips which comply with the electrical acceptance criteria are included in the plurality of chips that are processed in the manner shown in FIGS. 2A–2G. Any chips that are determined to be defective may be marked prior to the package fabrication process, and remain unpackaged on the wafer until the completion of the fabrication and cutting steps shown in FIGS. 2A–2F. Following the cutting (dicing) step of FIG. 2F, the defective chips may be discarded.

A plurality of individual interposer (tape) sections 106 are provided for attachment to the dies 100a, 100b, using the process shown in greater detail in FIGS. 2A–2G. The interposers 106 may be formed of a conventional material used for interposers, which may include polymers such as polyimides or other thermosetting polymers, or thermoplastic polymers. In general, each section 106 of interposer has three types of features formed on the section 106:

1. A plurality of bonding pads 103 located around the perimeter of the section 106 of interposer;
2. A plurality of lands 107 for receiving solder balls. The lands 107 may be distributed throughout the interior portion of the section 106 of interposer, and may be evenly spaced from one another. Even spacing using the minimum pitch between adjacent solder ball lands 107 and may allow the greatest number of interconnections per unit of surface area of the CSP; and
3. A respective lead 109 connecting each bonding pad 103 of the interposer to a respective solder ball land 107.

Figure 2A:
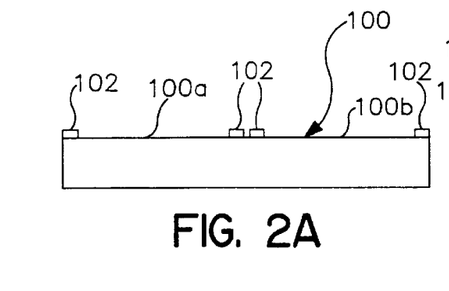
FIG. 2A shows a portion of the wafer of FIG. 1 before application of the interposers.

FIGS. 2A–2G show the main steps of the "wafer-level micro ball grid array process." FIG. 2A is a cross sectional view showing a portion of a semiconductor wafer 100 containing two chips 100a, 100b. It will be understood by one of ordinary skill in the art that, although FIG. 2A only shows a portion of the wafer 100 including two chips 100a and 100b for ease of illustration, a process according to the invention may be performed using a portion encompassing the whole wafer 100 shown in FIG. 1. As shown in FIG. 2A and FIG. 3, each chip 100a and 100b includes a plurality of electrical contacts or pads 102 at an outer edge of the chip.

Figure 2B:
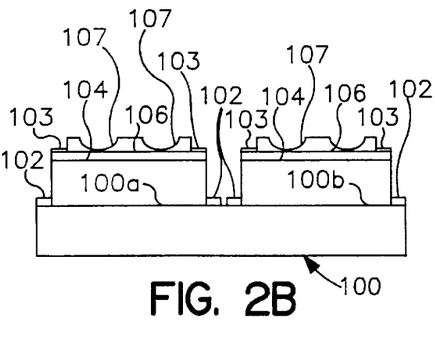
FIG. 2B shows the wafer portion of FIG. 2A after an interposer and a compliant material applied to each die.

FIG. 2B shows a compliant layer 104 which may be an elastomer or equivalent material, and is referred to hereafter as "elastomer 104". Elastomer 104 is provided on each of the plurality of chips 100a, 100b to prevent thermal mismatch problems due to the differing coefficients of thermal expansion of the chip 100a and the substrate 120 (shown in FIG. 2G). Electrical devices are subjected to thermal cycling as the devices are turned on and off, resulting in heating and cooling, respectively. The elastomer 104 absorbs the stresses created by the different expansion of the chip 100a and substrate 120. A commercially available interposer material having an elastomer material bonded thereto may be used. Alternatively, elastomer 104 may be applied to chip 100a as a separate layer prior to assembling interposer 106 onto elastomer 104.

A section 106 of a dielectric interposer is assembled on each respective one of the plurality of chips 100a, 100b, individually, without detaching the plurality of chips 100a, 100b from the semiconductor wafer 100. As shown in FIGS. 2B–2G, the interposer 106 may be formed from two sheets of a flexible material. Each section 106 of the interposer has a plurality of bonding pads 103 near an outer periphery of the section. The thickness of pads 103 has been exaggerated for easy visibility in FIGS. 2B–2F, but one of ordinary skill in the art of semiconductor packaging understands that the pads 103 and the leads 107 connected to pads 103 are formed of a thin film on the interposer 106 using a conventional additive or subtractive technique, such as plating or etching, in the same manner as the leads 107 and the solder ball lands 107. As best seen in FIG. 3, each bonding pad 103 lies near a respective contact 102 in the contact pattern area of the corresponding chip 100a. Thus, it is possible to construct a chip scale package 101 that is only slightly larger in area than the area of a bare die or flip chip (not shown) would be.

Figure 2C:
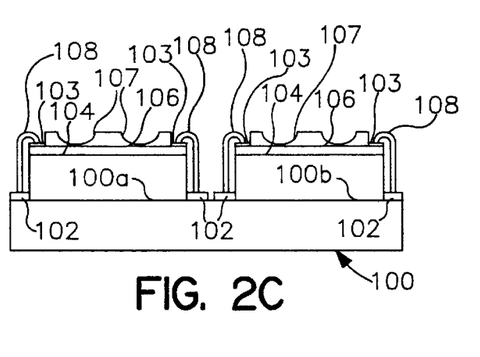
FIG. 2C shows the wafer portion of FIG. 2B after wire bonding the pads of each interposer to the contacts of the corresponding chip.
Figure 2D:
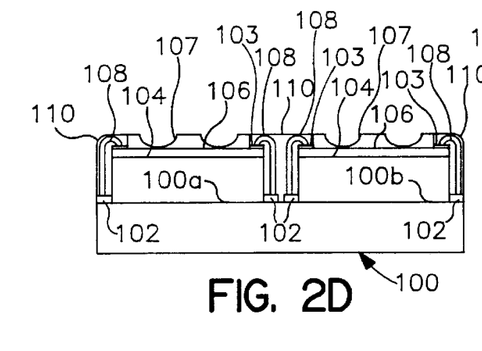
FIG. 2D shows the wafer portion of FIG. 2C after encapsulation of the lead wires.
Figure 2E:
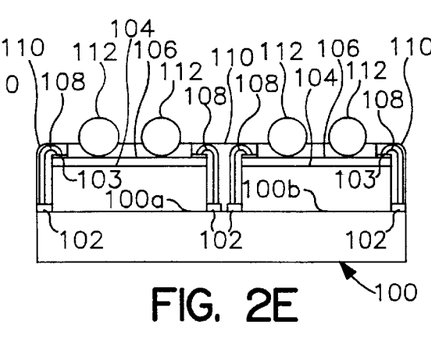
FIG. 2E shows the wafer portion of FIG. 2D after applying a solder ball to each respective land on the top surface of the interposer.
Figure 2F:
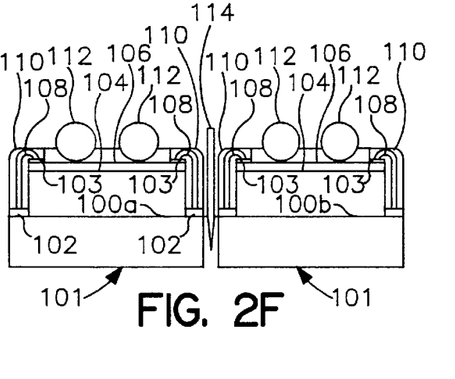
FIG. 2F shows the chip scale package of FIG. 2E being cut from the wafer.

As best seen in FIG. 3, the center of interposer 106 has a plurality of solder ball lands 107 for receiving solder balls 112 (shown in FIGS. 2E and 2F). Solder ball lands 107 are connected to bonding pads 103 of interposer 106 via a plurality of wirings 109 embedded in interposer 106.

FIGS. 2C and 3 show fine wire interconnections 108 used for wire bonding each bonding pad 103 of the interposer 106 to a respective one of the contacts 102 on the front surface of the corresponding chip 100. In the description of the invention and in the claims, the term "wire bonding" is defined as connecting two bonding pads with a separate and distinct interconnection element, such as a wire or conductive ribbon, by a process such as ultrasonic bonding, micro-resistant welding, thermosonic bonding, thermal bonding, compression bonding etc. The interconnection element in the wire bonding process is separate and distinct from any thin metal film or conductive layer formed on the interposer. Thus, the term "wire bonding," as used herein, is distinguished from forming a bond between a bonding pad on the chip and a thin metal film that has been formed (e.g., by deposition or etching) on the surface of the interposer.

According to one aspect of the invention, one end of each fine wire 108 is bonded to a respective bonding pad 103 of the interposer 106 using either ultrasonic wedge bonding or micro resistant welding, as described in detail below. The other end of each fine wire 108 is bonded to a respective contact 102 of the chip 100a by ultrasonic wedge bonding. This step of the process is described in greater detail below, with reference to FIGS. 5A and 5B, below.

FIG. 3 shows the fine wire interconnections 108 on the contacts 102 of a portion of the chip 100a and the bonding pads 103 of the interposer 106. One of ordinary skill in the art readily understands that the remaining bonding pads 103 on the interposer 106 are each connected to a respective contact 102 on the chip by a corresponding fine wire 108 similar to those shown in FIG. 3.

According to another aspect of the invention, as shown in FIG. 3, it is possible to include a fine wire interconnection 108a located at a corner of the interposer 106, and the corner fine wire interconnection 108a may be oriented at an angle less than 90 degrees from any of the sides of the section of interposer 106. For example, wire interconnections 108a may be oriented at an angle of 45 degrees from either side of the chip.

FIG. 2D shows an encapsulant 110 applied to encapsulate the wires on each of the plurality of chips. The encapsulant height is less than the height of the solder balls. Encapsulant 110 protects the fine wire interconnections 108. The encapsulant may be a conventional encapsulant material, such as an epoxy or polyimide, so that the fine wire interconnections 108 are free to flex as the contacts 102 of chip 100a and the pads 103 of the interposer shift relative to one another due to different coefficients of thermal expansion. Other encapsulant materials, having properties similar to those of rubber or gel may also be used within the scope of the invention. Following the application of the encapsulant 110, the encapsulant is cured.

To encapsulate the wires on the chips at the outer circumference of the wafer, a "tape dam" (not shown) may be placed around the outer circumference. The tape dam may be a ring, such that an annular trough is formed between the outside edge of the peripheral chips and the tape dam. The tape dam contains the encapsulant for the peripheral chips.

FIG. 2E shows wafer portion 100 after application of solder balls 112 to the top surface of interposer 106. Typically, a conventional solder flux is used to prepare the ball lands 107 on the surface of the interposer section 106, so that the solder bonds properly to the ball lands 107 of interposer 106. The solder balls may be approximately 280 micrometers high.

FIG. 2F shows a conventional diamond saw cutting blade 114 being used to cut the encapsulated chip packages 101 from the semiconductor wafer 100.

Figure 2G:
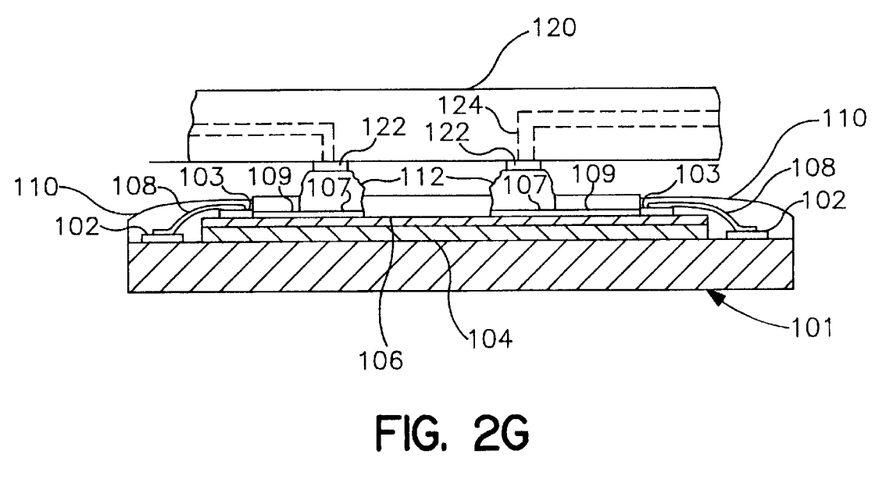
FIG. 2G shows one of the chip scale packages of FIG. 2F after it is soldered to a substrate.
Figure 3:
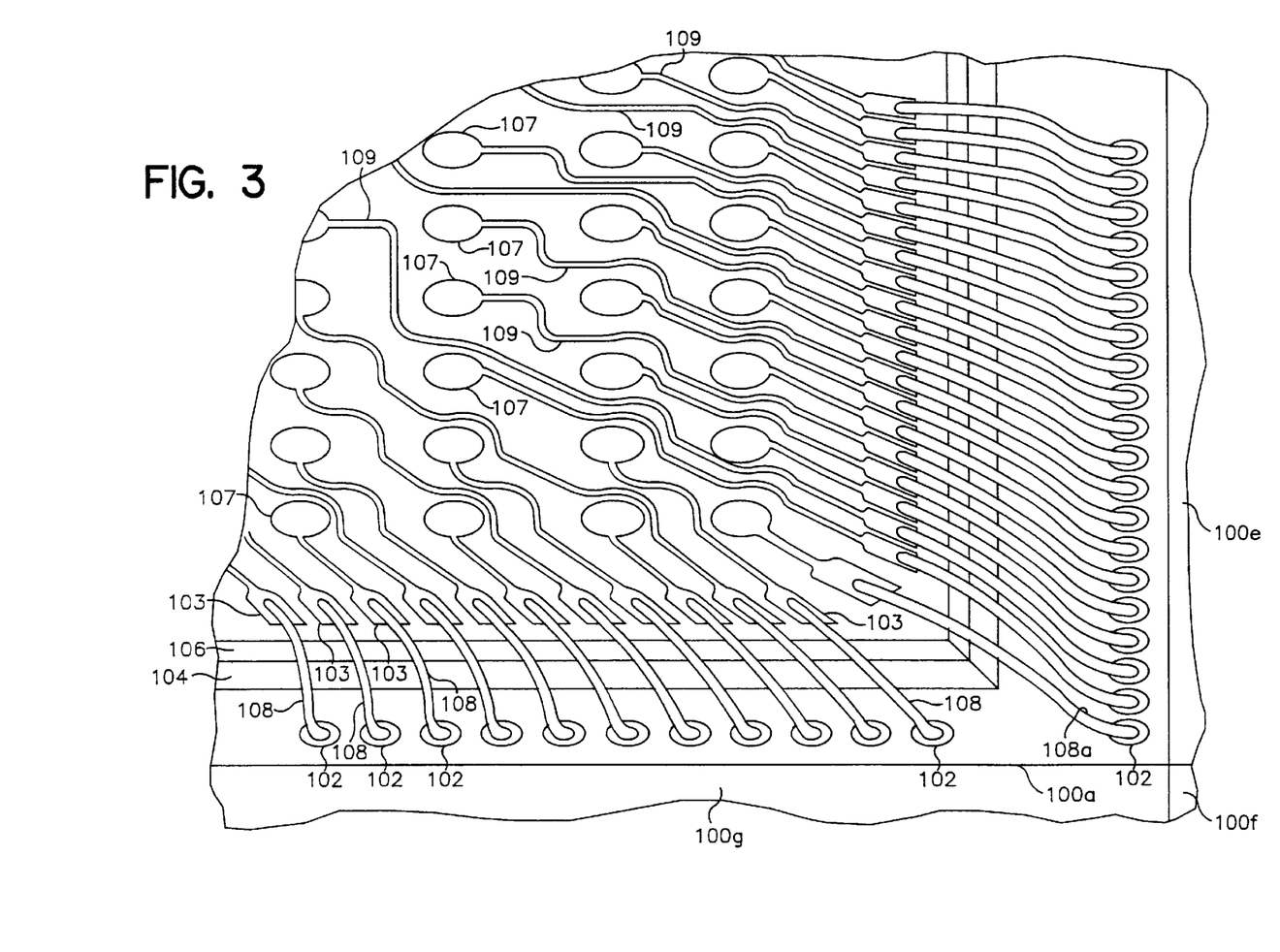
FIG. 3 is an enlarged isometric view of one of the dies of FIG. 1 while the step of wire bonding is partially completed.

FIG. 2G shows the cut encapsulated chip package 101 after it is assembled to the substrate 120. The substrate 120 has contacts 122 which coincide with the locations of the solder balls 112 on the interposer 106 of device 101. These contacts on the substrate 120 may be connected by way of vias 124 to circuit paths between layers within substrate 120, as shown in FIG. 2G, or on the side of substrate 120 opposite chip package 101. The chip package 101 is aligned with the substrate 120, and the solder balls 112 are reflowed by heating.

WIRE BONDING

Figure 5A:
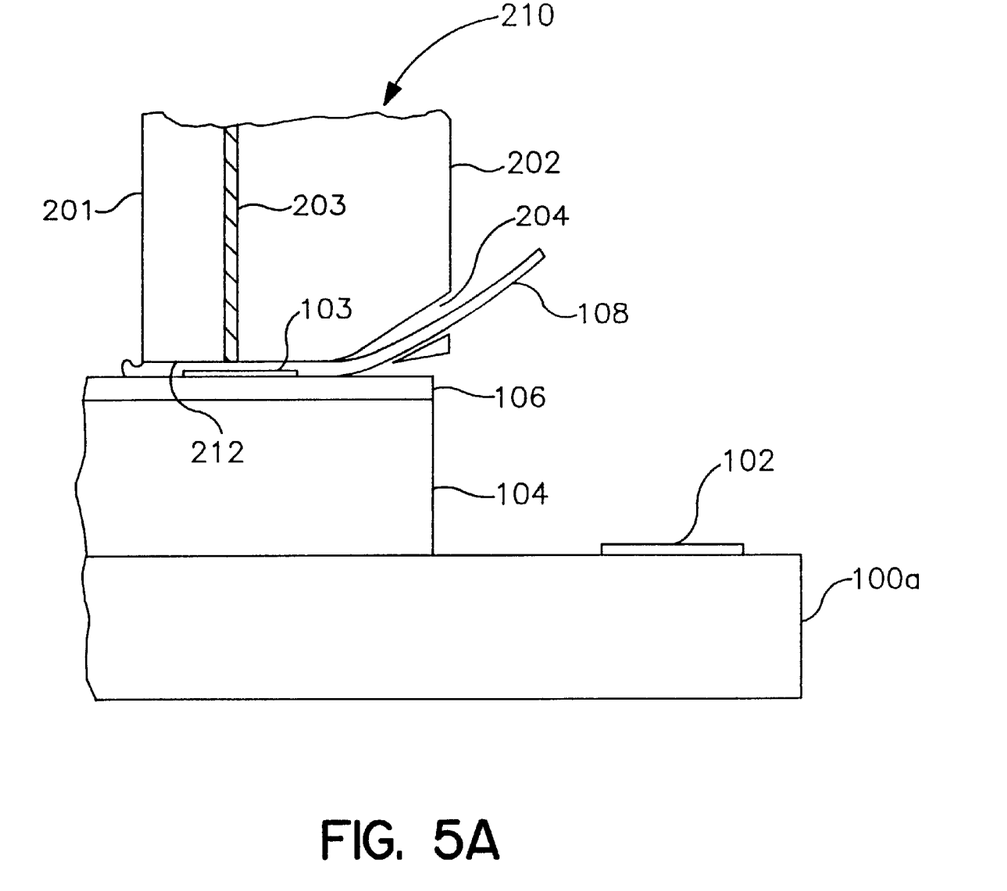
FIG. 5A is a diagram showing the step of wire bonding, using micro resistant welding to bond a wire to a bonding pad on the periphery of the interposer.

FIG. 5A is a diagram of an exemplary wire bonding process for a CSP according to the invention. As noted above with respect to FIG. 2C, according to one aspect of the invention, the interconnections between the interposer section 106 and the chip 100a are made by wire bonding using fine wires.

The inventor has determined that one of the difficulties of fabricating micro BGA type CSPs in a tape automated bonding process (with a plurality of individual chips bonded onto a linear tape such as that described in the U.S. Pat. No. 5,346,861 referenced above) is the difficulty in aligning the chip properly on the tape. The tape (interposer) in the '861 Patent has the locations of all of the bonding pads on the surface of the interposer fixed with respect to one another. The alignment of the chip on the interposer controls whether each one of the electrical connections between the terminals of the interposer and the contacts of the chip can be made successfully without great difficulty. To ensure that the terminals of the interposer are aligned properly with the contacts of the chip, each chip must be glued on with an accuracy of under 10 micrometers. Similarly, in the embodiment described in the '861 Patent in which individual interposer sections are bonded onto an uncut semiconductor wafer, it is still necessary to attach the interposer sections with less than 10 micrometer accuracy to ensure that all of the terminals in the interposer sections are properly aligned with the respective chip contacts to which they must be bonded.

To overcome this problem of the prior art, in one exemplary method according to the invention, the bonding pads 103 of the interposer section 106 are wire bonded to the contacts 102 of the chip 100a. This process may be performed using, for example, a wedge bonder such as the Model 1478 aluminum and gold wedge bonder manufactured by Kulicke & Soffa Industries, Inc. of Willow Grove, Pa. The model 1478 model has an XY table (for positioning semiconductor devices during wedge bonding) that can accommodate a full 203.2 mm (8 in.) wafer or a plurality of smaller wafers or wafer portions. The model 1478 has a Theta/Z-axis overhead bondhead, in addition to the XY table motion.

Using ultrasonic wedge bonding on a bonding pad 103 of an interposer 106 on top of a compliant elastomer 104 may require tuning of the bonding process, because the elastomer 104 absorbs some of the pressure of the ultrasonic bonding tool. One of ordinary skill in the art of wedge bonding techniques can readily adapt the wedge bonding parameters. For example, instead of using a typical vibration frequency of 60–100 Khz, the frequency for wedge bonding to the pads 103 on interposer 106 may be between 250 and 400 Khz.

By using fine wire interconnections 108, the invention achieves several advantages. One advantage is that the placement accuracy of the interposer on the wafer can be relaxed from about ±10 micrometers to about ±50 micrometers. Any increased error in alignment can be corrected by the wire bonding process, because the position at which each wire is connected can be adjusted. Because the placement accuracy requirements for wire bonding are substantially less stringent, it is possible to increase the production speed relative to prior art systems without sacrificing yield. The inventor believes that an increase in production from approximately 750 units per hour for a Micro BGA type process to approximately 5000 units per hour using the Wafer-level Micro BGA process according to the invention. This advantage of the invention may be contrasted to the fixed position of the printed wirings that were integrally formed on the interposer in the '861 Patent.

Another advantage of using wire bonding to connect the bonding pads 103 of the interposer section 106 with the contacts 102 of chip 100a according to the invention is the ability to replace one of the wirings 108 if the wiring 108 is found to have a defective bond (i.e., poor contact between the wiring 108 and either bonding pad 103 of interposer section 106 or contact 102 of chip 100a). Because the wiring is formed separately from the interposer section 106, a defective wire 108 may be removed with a tweezers or similar gripping device, and a new wire 108 may be applied in place of the wire that was removed. In contrast, the prior art system described in the '861 Patent could not be repaired in the event that one of the printed leads was damaged or did not bond properly to the contact on the chip. The printed leads in the '861 Patent are integrally formed on the interposer and cannot be replaced for purpose of performing a repair.

Still another advantage of wire bonding the CSPs is the ability to use corner wires, and more generally, to use wires that are not perpendicular to the side of the chip on which they are bonded. This allows much greater flexibility in the design of the interposer. For example, in some systems, it may be desirable to have many, of the wirings 108 oriented in a non-perpendicular direction. The wire bonding technique of the invention allows the selection of perpendicular or non-perpendicular wiring angles. In contrast, the bonding tools in prior art systems using the printed leads embedded in the interposer may not be able to use the non-perpendicular leads.

A further advantage of the invention is that it allows the use of a much simpler (and less expensive) interposer than that described in the '861 Patent. According to the invention, the interposer section 106 need only include: (1) bonding pads 103, (2) solder ball lands 107, and (3) leads 109 connecting each pad 103 to a respective land 107. The '861 patent describes a much more complex interposer having apertures and terminals that are all required to be aligned very tightly with the contacts on the underlying chip.

The inventor has also discovered that in some circumstances, depending on the thickness of elastomer 104, it may be difficult to apply sufficient pressure to apply ultrasonic energy to bond the wire 108 to the bonding pad 103 of the interposer section 106. According to another aspect of the invention, this problem may be overcome by using micro-resistant welding (MRW) to spot weld the wire 108 to the bonding pad 103 on interposer section 106. The conventional ultrasonic wedge bonding technique is used to bond the other end of wire 108 to the contact 102 of chip 100a. The MRW method described herein uses and supplements the basic principles that were applied in Microwelding sheet metals, as described in "*Micro Welding of Thin Sheet Components*" by K. Slee, Sheet Metal Industries, July 1978, which is expressly incorporated by reference herein.

The MRW may be performed using a wedge bonder as described above, such as the 1478 bonder manufactured by Kulicke & Soffa Industries, Inc., with a modified wedge bonding tool. A special pulse current power supply would be added for the MRW power. For example, the Unitech power supply by Miyachi of Monrovia, Calif. may be used. An exemplary MRW process may use a current of up to 100 Amperes at 1 to 10 Volts, with a pulse duration of up to 100 milliseconds.

Figure 4:
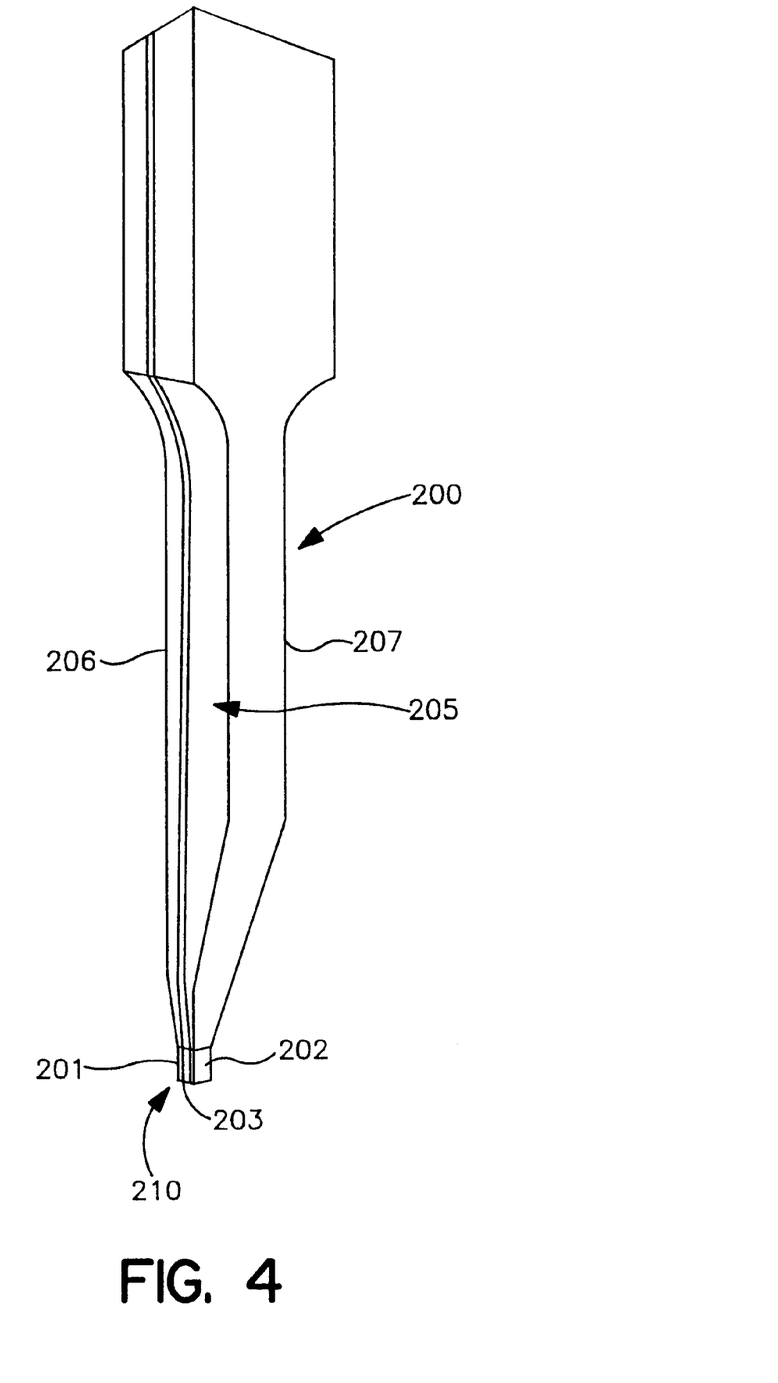
FIG. 4 is a perspective view of an exemplary tool suitable for use in micro resistant welding and wedge bonding.

FIG. 4 is a perspective view of a wedge bonding tool 200 suitable for performing the MRW and ultrasonic bonding steps in a wire bonder. The wedge bonding tool 200 includes a body portion 205 made of an electrically conductive material. The body portion 205 includes a first electrode 206 and a second electrode 207. An insulating spacer 203 separates the first and second electrodes 206 and 207.

A wedge working tip 210 is provided on one end of the body portion 205. The wedge working tip 210 has a foot 212 and a wire hole 204 through the wedge working tip 210 for directing a wire 108 under the foot 212. The foot 212 may have a notch for holding the wire. One end 201 of the first conductor 206 forms a first portion of the wedge working tip 210. The other end 202 of the second conductor 207 forms the second portion of the wedge working tip 210. The electrodes 201 and 202 may be formed from Tungsten Carbide, Molybdenum, Osmium or other functionally equivalent metal.

Other details of the size, shape and contour of the wedge bonding tool may be determined using conventional principles. For example, the tool may be formed in accordance with the variety of wedge bonding tool configurations described in U.S. Pat. No. 5,558,270 to Nachone et al. (which is expressly incorporated by reference herein), except that the tool would be modified to include the dual electrode configuration described above. Other shapes of wedge bonding tools may also be adapted to include the dual electrode structure according to the invention.

Figure 5B:
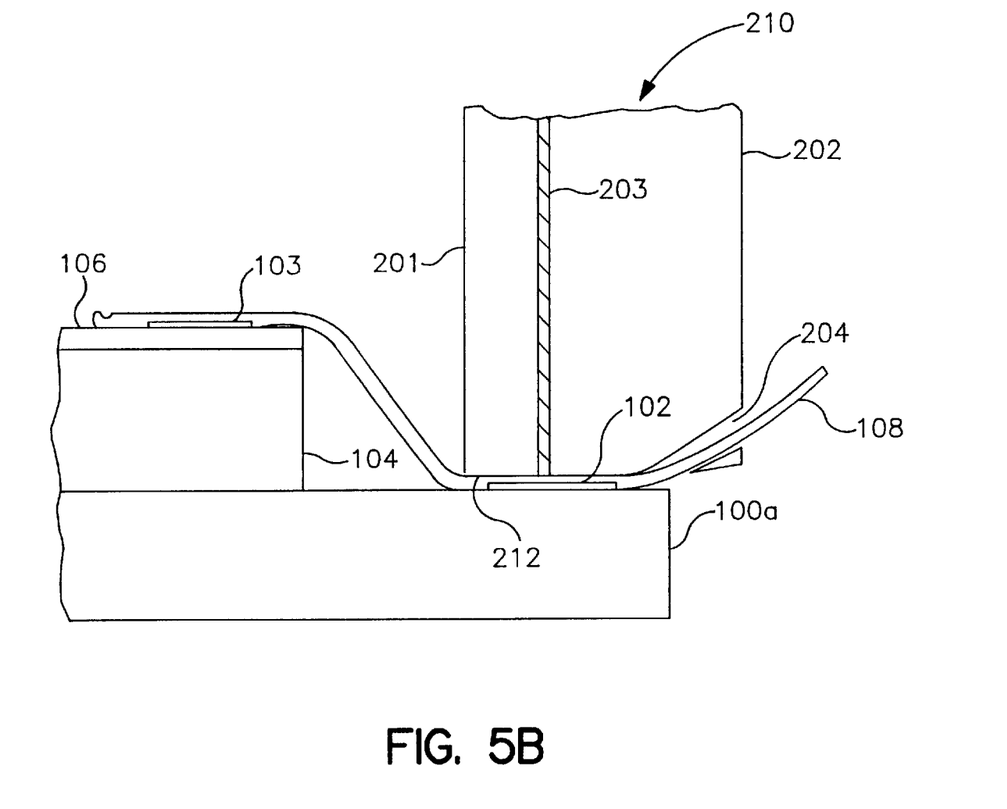
FIG. 5B is a diagram showing the step of wire bonding, using ultrasonic wedge bonding to bond the second end of the wire to the chip.

FIGS. 5A and 5B show how a wire 108 is bonded using MRW on the bonding pad 103 of interposer 106 and ultrasonic bonding on the contact 102 of chip 100*a*. As shown in FIG. 5A, the dual electrode bonding tool 200 may be used when the device does not have a ground path.

In operation, the current is transferred from the first electrode 201 to the second electrode 202. The current pulse is controlled in amplitude and duration, so as to cause localized heating to weld the wire 108 to the bonding pad 103. In a variation of this technique, ultrasonic bonding may be used first, and then the current applied afterward to enhance the bond and possibly increase the tool life. One of ordinary skill in the art recognizes that it is also possible to use ultrasonic bonding for bonding all of the wires 108 to the pads 103 of the interposer section 106, and only apply the current for MRW afterward for those wires which do not have a good contact with their respective pads 103.

As shown in FIG. 5B, the second end of wire 108 is ultrasonically wedge bonded to the contact 102 of chip 100*a*. MRW is not used on chip 100*a*, because the high current could damage the chip. The bonding tool 200 is configured so as to perform similarly to a conventional wedge bonding tool when the welding current is not applied to the tool 200.

If the device has a ground plane, it is not necessary to use a dual electrode bonding tool, and a standard wedge bonding tool may be used.

Although the example of FIG. 1 shows a method for wafer level integration, one of ordinary skill in the art will readily recognize that the wire bonding method described above may also be used for making a single chip. This single chip could be on a wafer 100 as shown in FIG. 1, or could be separate from the wafer 100, in which case the chip would look similar to the chip 100*a* in FIG. 3, with the adjacent chips 100*e*, 100*f* and 100*g* already removed. A semiconductor chip 100*a* is provided, having a contact pattern area including a pattern of contacts 102 on a surface of the chip 100*a*. A section 106 of a dielectric interposer is assembled to the chip 100*a*. The section 106 of interposer has a plurality of bonding pads 103 near an outer periphery of the section 106, such that each bonding pad 103 lies near the contact pattern area of the chip 100*a*. Each bonding pad 103 is wire bond to a respective one of the contacts 102 on the front surface of the chip 100*a*. The wire bonding step includes: (1) bonding one end of each wire 108 to a respective bonding pad 103 of the interposer using micro-resistant welding, and (2) bonding the other end of each wire 108 to a respective contact 102 of the chip 100*a* using ultrasonic bonding. An encapsulant 110 is applied to encapsulate the wires on the chip.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A method of assembling a plurality of semiconductor chips, comprising the steps of:
   (a) providing a portion of a semiconductor wafer containing the plurality of chips thereon, each of the plurality of chips having a contact pattern area including a pattern of contacts on a surface of the chip;
   (b) assembling a respective section of a dielectric interposer to each respective one of the plurality of chips individually, without detaching the plurality of chips from the portion of the semiconductor wafer, each section of interposer having a plurality of bonding pads near an outer periphery of the section, such that each bonding pad lies near the contact pattern area of the corresponding one of the plurality of chips;
   (c) wire bonding each bonding pad to a respective one of the contacts on the front surface of the corresponding one of the plurality of chips;
   (d) applying an encapsulant to encapsulate the wires on each of the plurality of chips; and
   (e) cutting the encapsulated chips from the semiconductor wafer.

2. A method according to claim 1, wherein step (c) includes bonding one end of each wire to a respective bonding pad using one of the group consisting of micro resistant welding and ultrasonic bonding.

3. A method according to claim 2, wherein step (c) includes:
   bonding one end of each wire to a respective bonding pad of the interposer using micro-resistant welding, and
   bonding the other end of each wire to a respective contact of the chip using ultrasonic bonding.

4. A method according to claim 3, wherein step (c) includes using a dual electrode bonding tool to perform micro-resistant welding.

5. A method according to claim 1, including, prior to step (a), the steps of:
   (1) testing all of the chips on the portion of the semiconductor wafer;
   (2) determining whether each individual chip on the portion of the semiconductor wafer complies with a set of acceptance criteria; and
   (3) selecting only those chips which comply with the acceptance criteria for inclusion in the plurality of chips.

6. A method according to claim 1, wherein step (b) includes providing an elastomer between each of the plurality of chips and the respective interposer on the chip.

7. A method according to claim 1, wherein the portion of the semiconductor wafer includes the whole semiconductor wafer.

8. A method according to claim 1, wherein one end of each wire is bonded to a respective bonding pad of the interpose using ultrasonic bonding, and the other end of each wire is bonded to a respective contact of the chip using ultrasonic bonding.

9. A method according to claim 1, further comprising, between steps (c) and (d), the steps of:

(c1) detecting a defective bond at either end of one of the wires;

(c2) removing the one wire having the defective bond; and (c3) wire bonding a new wire to connect the bonding pad and contact corresponding to the wire removed in step (c2).

10. A method according to claim 1, wherein step (c) includes bonding one of the wires that is oriented at an angle substantially less than 90 degrees from any side of the section of interposer having the bonding pad to which the one wire is bonded.

11. A method of assembling a semiconductor chip package, comprising the steps of:

(a) providing a semiconductor chip having a contact pattern area including a pattern of contacts on a surface of the chip;

(b) assembling a section of a dielectric interposer to the chip, the section of interposer having a plurality of bonding pads near an outer periphery of the section, such that each bonding pad lies near the contact pattern area of the chip;

(c) wire bonding each bonding pad to a respective one of the contacts on the front surface of the chip, including:

(1) bonding one end of each wire to a respective bonding pad of the interposer using micro-resistant welding, and (2) bonding the other end of each wire to a respective contact of the chip using ultrasonic bonding;

(d) applying an encapsulant to encapsulate the wires on the chip.

12. A method according to claim 11, wherein step (c) includes using a dual electrode bonding tool to perform micro-resistant welding.

13. A method according to claim 11, wherein step (b) includes providing an elastomer between the chip and the respective interposer on the chip.

14. A method according to claim 11, further comprising, between steps (c) and (d), the steps of:

(c1) detecting a defective bond at either end of one of the wires;

(c2) removing the one wire having the defective bond; and (c3) wire bonding a new wire to connect the bonding pad and contact corresponding to the wire removed in step (c2).

15. A method according to claim 11, wherein step (c) includes bonding one of the wires that is oriented at an angle substantially less than 90 degrees from any side of the section of interposer having the bonding pad to which the one wire is bonded.

* * * * *

UNITED STATES PATENT AND TRADE MARK OFFICE
CERTIFICATE OF CORRECTION

PATENT NO. : 5,950,070
DATED : September 7, 1999
INVENTOR(S) : Razon et al.

It is certified that error appears in the above-identified patent and that said Letters Patent is hereby corrected as shown below:

Cover page, item [56] References Cited, Other Publications, in the "J. Simon et al. reference" delete "3".

Cover page, item [57] Abstract, line 19, insert a period --.-- between the words "bonding" and "If".

Signed and Sealed this

Twenty-sixth Day of December, 2000

Attest:

Q. TODD DICKINSON

*Attesting Officer*     *Director of Patents and Trademarks*

Adverse Decision In Interference

Patent No. 5,950,070, Elirazon, Walter Von Seggern, METHOD OF FORMING A CHIP SCALE PACKAGE, AND A TOOL USED IN FORMING THE CHIP SCALE PACKAGE, Interference No. 105,348, final judgment adverse to the patentees rendered, October 6, 2005, as to claims 1-15.

*(Official Gazette, February 28, 2006)*